(12) United States Patent
Nakamura et al.

(10) Patent No.: US 7,849,905 B2
(45) Date of Patent: Dec. 14, 2010

(54) STRIPPING DEVICE AND STRIPPING APPARATUS

(75) Inventors: Akihiko Nakamura, Kanagawa (JP); Atsushi Miyanari, Kanagawa (JP); Yoshihiro Inao, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1037 days.

(21) Appl. No.: 11/633,499

(22) Filed: Dec. 4, 2006

(65) Prior Publication Data

US 2007/0125751 A1     Jun. 7, 2007

(30) Foreign Application Priority Data

Dec. 6, 2005   (JP) ............................ 2005-352525

(51) Int. Cl.
| | |
|---|---|
| *B29C 63/00* | (2006.01) |
| *B29C 65/00* | (2006.01) |
| *B32B 37/00* | (2006.01) |
| *B32B 41/00* | (2006.01) |
| *B32B 38/04* | (2006.01) |
| *B65C 9/40* | (2006.01) |
| *G05G 15/00* | (2006.01) |
| *B31F 1/28* | (2006.01) |
| *B26D 5/00* | (2006.01) |

(52) U.S. Cl. .................. 156/584; 156/358; 156/389; 156/353; 156/267; 156/261

(58) Field of Classification Search ............... 156/584, 156/358, 389, 353, 267, 261; 15/3, 21.1, 15/77

See application file for complete search history.

(56) References Cited

U.S. PATENT DOCUMENTS

| | | | | |
|---|---|---|---|---|
| 4,247,590 A | * | 1/1981 | Hayakawa et al. | 428/210 |
| 4,258,561 A | * | 3/1981 | Platt | 72/142 |
| 4,466,852 A | * | 8/1984 | Beltz et al. | 156/344 |
| 4,711,014 A | * | 12/1987 | Althouse | 29/412 |
| 5,310,442 A | * | 5/1994 | Ametani | 156/353 |
| 5,480,842 A | * | 1/1996 | Clifton et al. | 438/464 |
| 5,729,856 A | * | 3/1998 | Jang et al. | 15/88.1 |
| 6,235,387 B1 | * | 5/2001 | Bennett et al. | 428/355 AC |
| 2006/0037694 A1 | * | 2/2006 | Yamamoto et al. | 156/250 |

FOREIGN PATENT DOCUMENTS

JP     2002-270676     9/2002

* cited by examiner

*Primary Examiner*—Khanh Nguyen
*Assistant Examiner*—Matthew Hoover
(74) *Attorney, Agent, or Firm*—Carrier Blackman & Associates, P.C.; Joseph P. Carrier; William D. Blackman (57) ABSTRACT

A stripping apparatus has a simplified structure for stripping a supporting plate from a layered structure, occupies less space, and strips a supporting plate in a shorter period of time. The stripping apparatus comprises a transfer robot, a cassette, a stripping device and a cleaning device which surround the transfer robot. The stripping device comprises a chucking plate for attracting and retaining a layered structure, and a stripping plate for stripping the supporting plate from the layered structure. The chucking plate is constructed so as to be rotated by 180° within a vertical plane, elevated and lowered in a vertical direction in a state of retaining the layered structure.

20 Claims, 11 Drawing Sheets

STRIPPING DEVICE AND STRIPPING APPARATUS

CROSS-REFERENCE TO RELATED APPLICATIONS

The present application claims priority from Japanese patent application 2005-352525, filed 6 Dec. 2005. The entire disclosure of the referenced priority document is incorporated herein by reference.

BACKGROUND OF THE INVENTION

1. Field of the Invention

The present invention relates to a stripping device and a stripping apparatus including the stripping device for stripping a supporting plate from a substrate such as a semiconductor wafer to be used when the substrate is thinned.

2. Description of the Background Art

There is a continuing need to make IC cards and cell phones thinner, smaller, and lighter. In order to satisfy this need, semiconductor chips to be incorporated therein must be thin. Although at present the thickness of a wafer which forms a semiconductor chip is 125-150 µm, it is expected that the thickness of a semiconductor wafer must be 25-50 µm for a next generation of chips.

Figure 11:
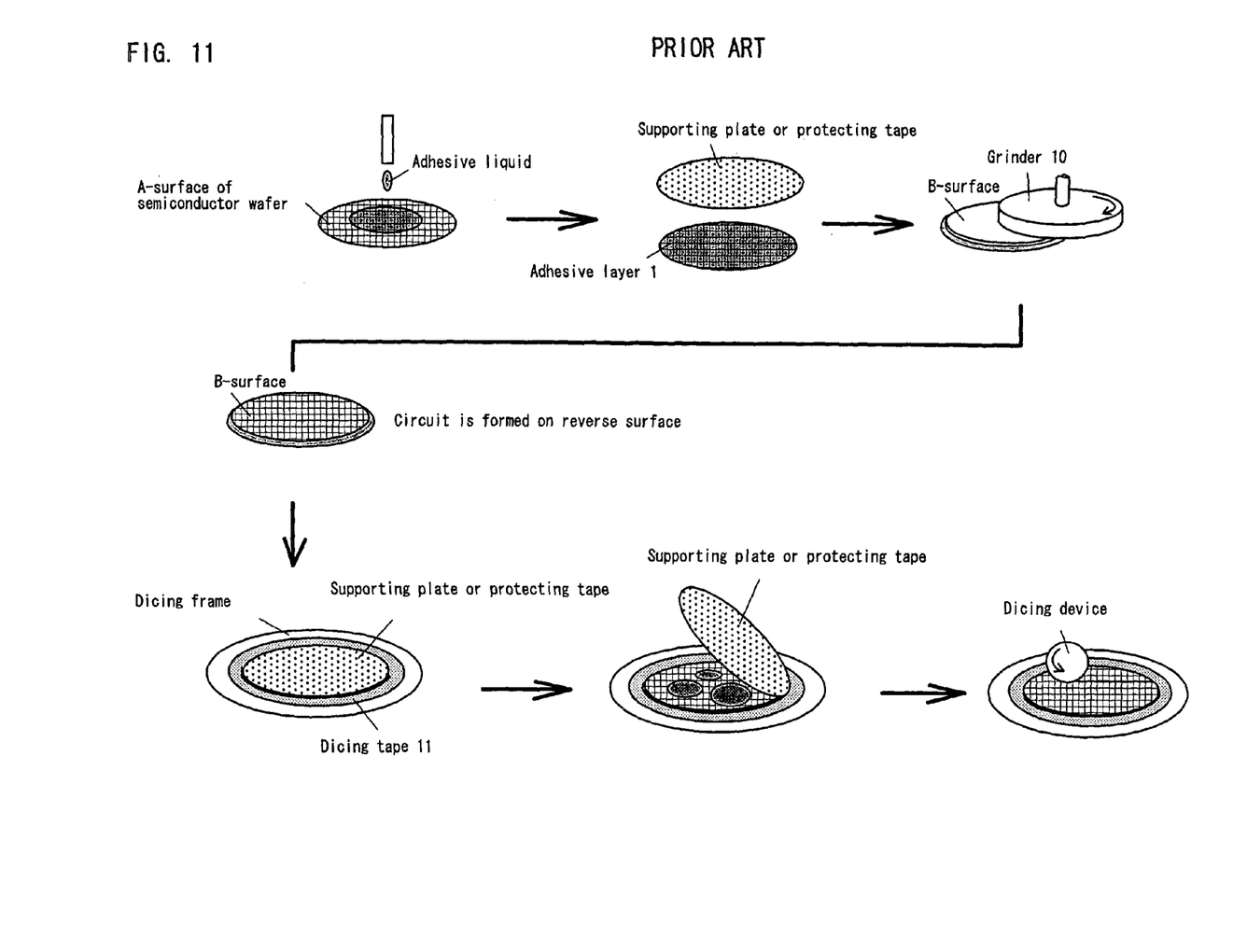
FIG. 11 is a view explaining a conventional process for thinning a substrate.

An example of a conventional method for thinning a semiconductor wafer is shown in FIG. 11.

Specifically, a supporting plate or a protecting tape is attached to a surface (A-surface) of a semiconductor wafer on which a circuit (element) has been formed. This is turned over, and the rear surface (B-surface) of the semiconductor wafer is ground by a grinder to make the wafer thinner. Another circuit is formed on the rear surface (B-surface) of the semiconductor wafer which has been thinned, and this is fixed onto a dicing tape retained by a dicing frame. The supporting plate or the protecting tape covering the surface (A-surface) of the semiconductor wafer is stripped in this state. Next, the wafer is cut into chips by a dicing device (See Document 1).

[Document 1] Japanese Patent Application Publication No. 2002-270676

The present inventors have filed an application with respect to a method for stripping a supporting plate from a semiconductor wafer. This method is performed by using a plate in which a first penetrating hole is formed in a central portion of the plate in the thickness direction and a second penetrating hole is formed in a peripheral portion of the plate in the thickness direction.

Figure 12A:
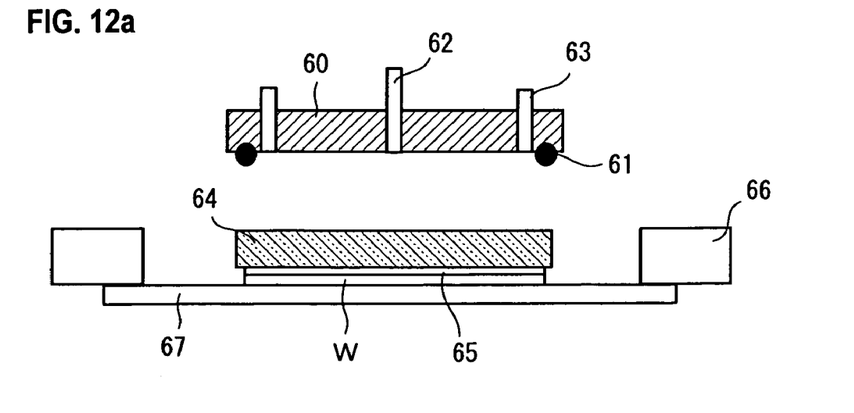
FIG. 12 is a view explaining a drawback of the conventional art.
Figure 12B:
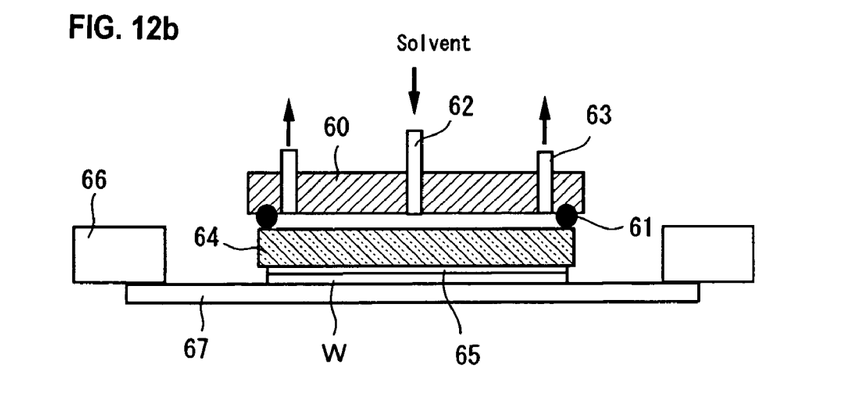

Specifically, as shown in FIGS. 12a and 12b, a plate 60 is applied to a supporting plate 64 of a layered structure in which the supporting plate 64 has been attached to a semiconductor wafer W in a state where an O-ring 61 is interposed. Next, a solvent is supplied to a space formed by the O-ring 61 through a central penetrating hole 62 so as to distribute the solvent over an adhesive layer 65 through the penetrating hole of the supporting plate 64. In this way, the adhesive layer 65 is dissolved by the solvent. The solvent is withdrawn from a peripheral penetrating hole 63 of the plate 60.

In this stripping method, however, the solvent is supplied from above with respect to the plate 60 and the layered structure. Therefore, in order to withdraw the solvent from the periphery of the plate 60, the solvent needs to be sucked. Therefore, a sucking device is required, and an extra space is required for this additional device.

Also, if the solvent leaks from around the O-ring 61, the solvent reaches a dicing tape 67 of a dicing frame 66, which results in stripping of the dicing tape 67 from the layered structure.

In order to solve this drawback, it is possible to supply the solvent from below with respect to the plate 60. In this instance, however, the layered structure needs to be rotated by a rotating device so as to locate the supporting plate on the plate side (i.e., mount the layered structure on the plate) at the time of transferring the layered structure from a transfer robot to a stripping apparatus. Therefore, extra space is required for this additional device, and the stripping process takes longer because additional time is required for transferring the layered structure between the devices.

In order to solve the above-mentioned problems, an object of the present invention is to provide a stripping device and a stripping apparatus including the stripping device which make it possible to simplify a structure of the apparatus for stripping a supporting plate from a layered structure, reduce the space for the apparatus, and also reduce the time required for stripping the supporting plate.

SUMMARY OF THE INVENTION

In order to solve the above-mentioned problems, according to the present invention, there is provided a stripping device which strips a supporting plate from a layered structure in which a substrate is attached to the supporting plate, comprising a chucking plate for attracting and retaining the layered structure, a stripping plate for stripping the supporting plate from the layered structure, and a moving mechanism which rotates the chucking plate by 180° within a vertical plane, and elevates and lowers the chucking plate in a vertical direction in a state of retaining the layered structure.

Since the stripping device of the present invention has a chucking plate for attracting and retaining the layered structure, a stripping plate for stripping the supporting plate from the layered structure, and a moving mechanism which rotates the chucking plate by 180° within a vertical plane, and elevates and lowers the chucking plate in a vertical direction in a state of retaining the layered structure, it is possible to easily mount the layered structure on the chucking plate (in a state where the substrate side faces to the chucking plate) in a short period of time, and supply a solvent from below with respect to the chucking plate and the layered structure without installing an additional rotating device.

According to the present invention, there is also provided a stripping apparatus for stripping a supporting plate from a layered structure in which a substrate is attached to the supporting plate, comprising a transfer robot, a cassette provided so as to surround the transfer robot, the above-described stripping device, and a cleaning device which cleans the substrate.

Since the stripping apparatus of the present invention has at least a transfer robot, a cassette provided so as to surround the transfer robot, the above-described stripping device, and a cleaning device which cleans the substrate, it is possible to efficiently perform a series of processes for stripping the supporting plate (including a cleaning process) in a single apparatus, and simplify the structure of the apparatus.

It is also possible to reduce the time for transferring the substrate amongst the various processing devices of the apparatus in comparison to a conventional arrangement in which the processing devices are separately provided (for example, from the stripping device to the cleaning device, or from the cassette to the stripping device). It is also possible to further reduce the time for the stripping process.

In this way, the structure of the device can be simplified, and the time for the stripping process can be reduced. In addition, it is possible to solve the problem that the dicing tape is stripped from the layered structure or contamination occurs because the solvent leaks.

In addition, by installing the cleaning device, the solvent which has been used in the cleaning device can be used also in the stripping device, thereby reducing the amount of a new solvent which must be used.

In the above-described stripping device and apparatus, if the stripping plate is non-rotatable and is combined with the chucking plate and the moving mechanism, it is possible to further reduce the time required for the stripping process.

DETAILED DESCRIPTION OF THE PREFERRED EMBODIMENTS

Figure 1:
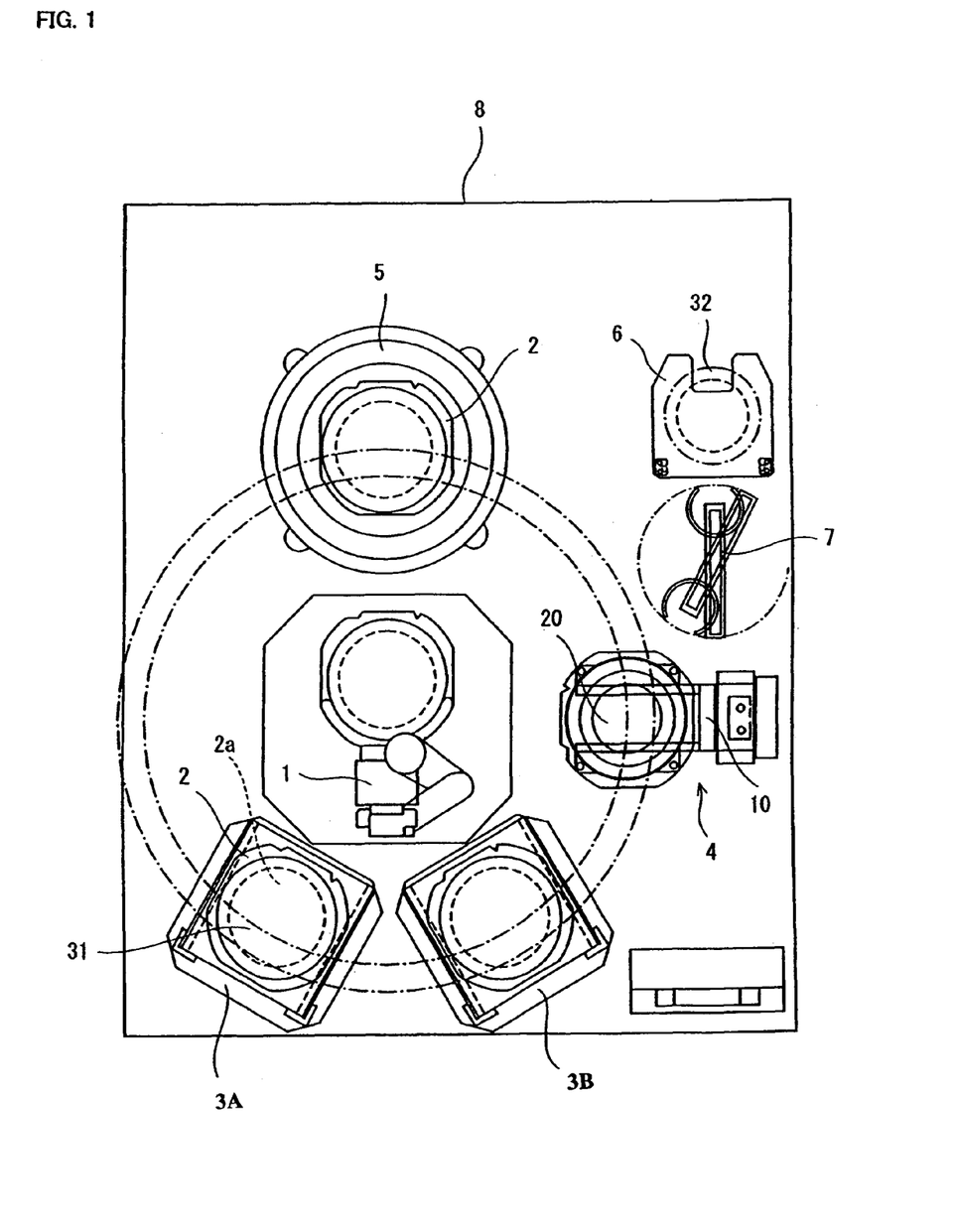
FIG. 1 is a schematic plan view showing an embodiment of a stripping apparatus according to the present invention.
Figure 2:
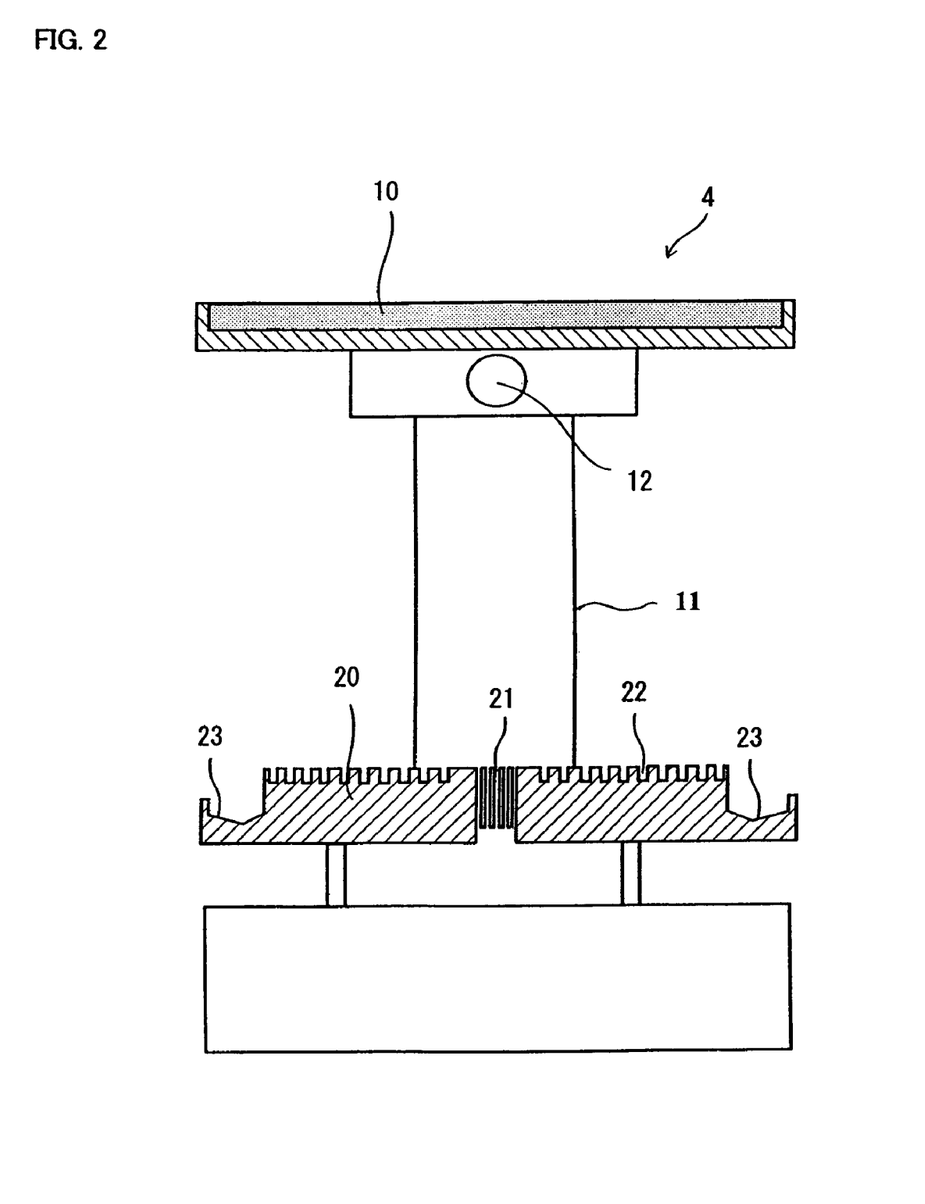
FIG. 2 is a front view of a stripping device of the stripping apparatus.
Figure 3:
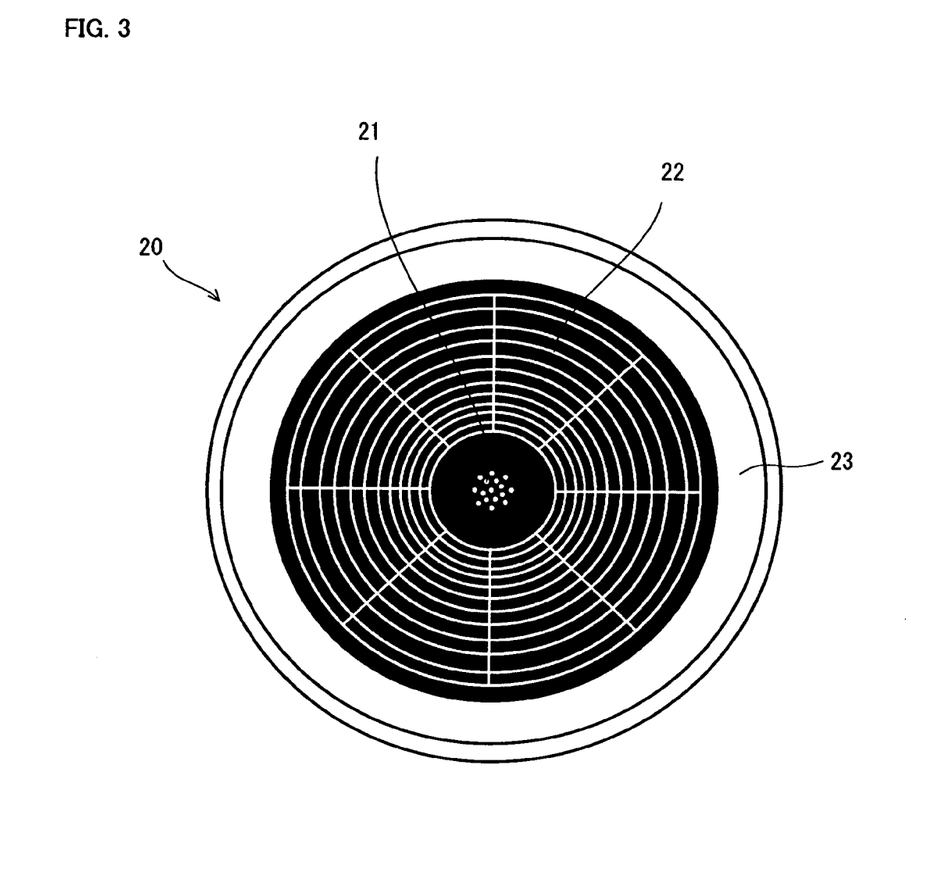
FIG. 3 is a plan view of a stripping plate of the stripping device.

Embodiments of the present invention will be described below with reference to the attached drawings. FIG. 1 is a schematic plan view showing an embodiment of a stripping apparatus according to the present invention, FIG. 2 is a front view of a stripping device of the stripping apparatus, and FIG. 3 is a plan view of a stripping plate of the stripping device.

The embodiments of the present invention include a structure in which a dicing tape mounter is installed in the stripping apparatus, and a structure in which no dicing tape mounter is installed. The former will be described first, and the latter will be described next.

In a stripping apparatus 8 of the present embodiment shown in FIG. 1, a transfer robot 1 is provided. Also, a cassette 3, a stripping device 4, and a cleaning device 5 are provided to surround the transfer robot 1. Another cassette 6 for a supporting plate is provided near the stripping device 4, and a withdrawing robot 7 is provided between the stripping device 4 and the cassette 6. A dicing tape mounter is also provided to surround the transfer robot 1 although it is not shown in the drawing.

The cassette 3 is comprised of a cassette 3A for storing a layered structure along with a dicing tape and a dicing frame, and a cassette 3B for storing a semiconductor wafer (along with a dicing tape and a dicing frame) which has undergone a cleaning process.

The stripping device 4 is comprised of a chucking plate 10, and a stripping plate 20 provided below the chucking plate 10 as shown in FIGS. 2 and 3. The chucking plate 10 serves to attract and retain the layered structure and apply the supporting plate side of the layered structure to the top surface of the stripping plate 20. The stripping plate 20 serves to supply a solvent to the layered structure chucked by the chucking plate 10.

More specifically, the chucking plate 10 is supported by an elevating member 11 via a horizontal shaft 12, and constructed so as to be elevated and lowered in a vertical direction, and rotated by 180° within a vertical plane. The chucking plate 10 is made of a porous material, for example. The surface of the chucking plate 10 for attracting and retaining a layered structure and the reverse surface are connected to a vacuum source. The elevating member 11 and the horizontal shaft 12 are components of a moving mechanism.

The stripping plate 20 has a plurality of solvent supply holes 21 in the central portion thereof, grooves 22 connecting to a vacuum source in the top surface, and a recessed section 23 for withdrawing a solvent in the peripheral portion of the top surface. With this structure, after an adhesive between the supporting plate and the semiconductor wafer of the layered structure is dissolved, the semiconductor wafer alone can be chucked by the chucking plate 10 so as to be separated upward, and the supporting plate can be left in the top surface of the stripping plate 20 as described below.

With this structure of the stripping means 4, it is possible to easily mount the layered structure on the chucking plate 10 (in a state where the semiconductor wafer side faces to the chucking plate 10) in a short period of time, and supply a solvent from below with respect to the chucking plate 10 without installing a special rotating device. With this, it is possible to prevent the problems that the dicing tape is stripped from the layered structure and contamination occurred because the solvent leaks.

The cleaning device 5 serves to clean the surface of the semiconductor wafer after the supporting plate is stripped from the semiconductor wafer. The cleaning device 5 is connected to a cleaning liquid supply means which is not shown in the drawing (provided with a new liquid supply tank and a solvent withdrawing tank) through a pipe.

In order to clean the surface of the semiconductor wafer, a new liquid (such as alcohol or organic thinner) from the new liquid supply tank is used, and a solvent used for cleaning is withdrawn to the solvent withdrawing tank.

The withdrawing robot 7 serves to transfer the supporting plate stripped from the semiconductor wafer by the stripping device 4 to the cassette 6 to be stored.

The dicing tape mounter, which is not shown in the drawing, serves to attach the dicing tape to a surface of the layered structure, i.e., the reverse surface of the semiconductor wafer.

Next, the process for stripping the supporting plate from the layered structure by using the stripping apparatus 8 will be described.

Figure 5:
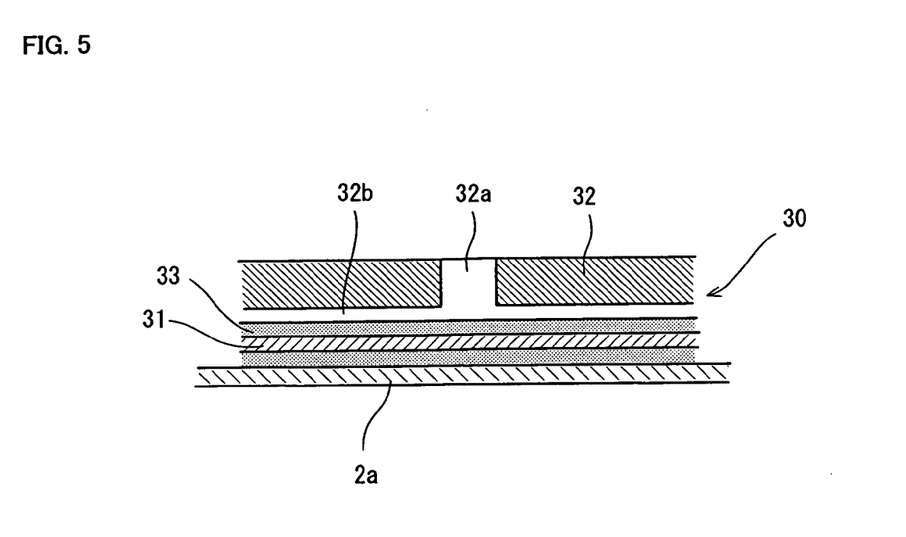
FIG. 5 is an enlarged cross-sectional view of the main part of the layered structure.

The layered structure 30 is constructed as follows:

The layered structure 30 is comprised of the semiconductor wafer 31 and the supporting plate 32 which are bonded with each other by an adhesive 33 as shown in FIG. 5. More specifically, the supporting plate 32 is attached to the A-surface of the semiconductor wafer 31 on which a circuit has been formed by the adhesive 33.

Figure 6:
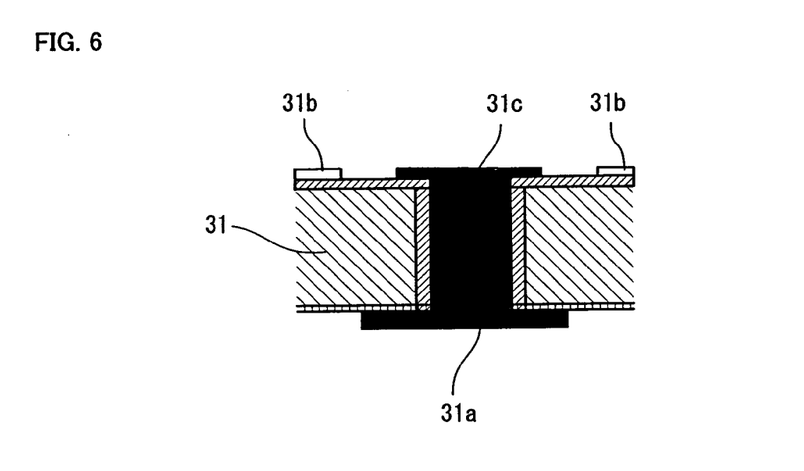
FIG. 6 is an enlarged cross-sectional view of the main part of a semiconductor wafer.

In the layered structure 30, another circuit 31b is formed on the B-surface of the semiconductor wafer 31 as shown in FIG.

6. For example, the circuit 31a formed on A-surface and the circuit 31b formed on B-surface may be electrically connected by a through electrode 31c.

A penetrating hole 32a for supplying a solvent is formed on a surface of the supporting plate 32 to be attached to the semiconductor wafer 31, and a groove 32b for distributing the solvent supplied from the penetrating hole 32a over the whole surface is formed on the same surface of the supporting plate 32. The shape of the groove 32b may be a grid pattern, a staggered pattern, or a honeycomb (hexagonal) pattern.

Figure 4:
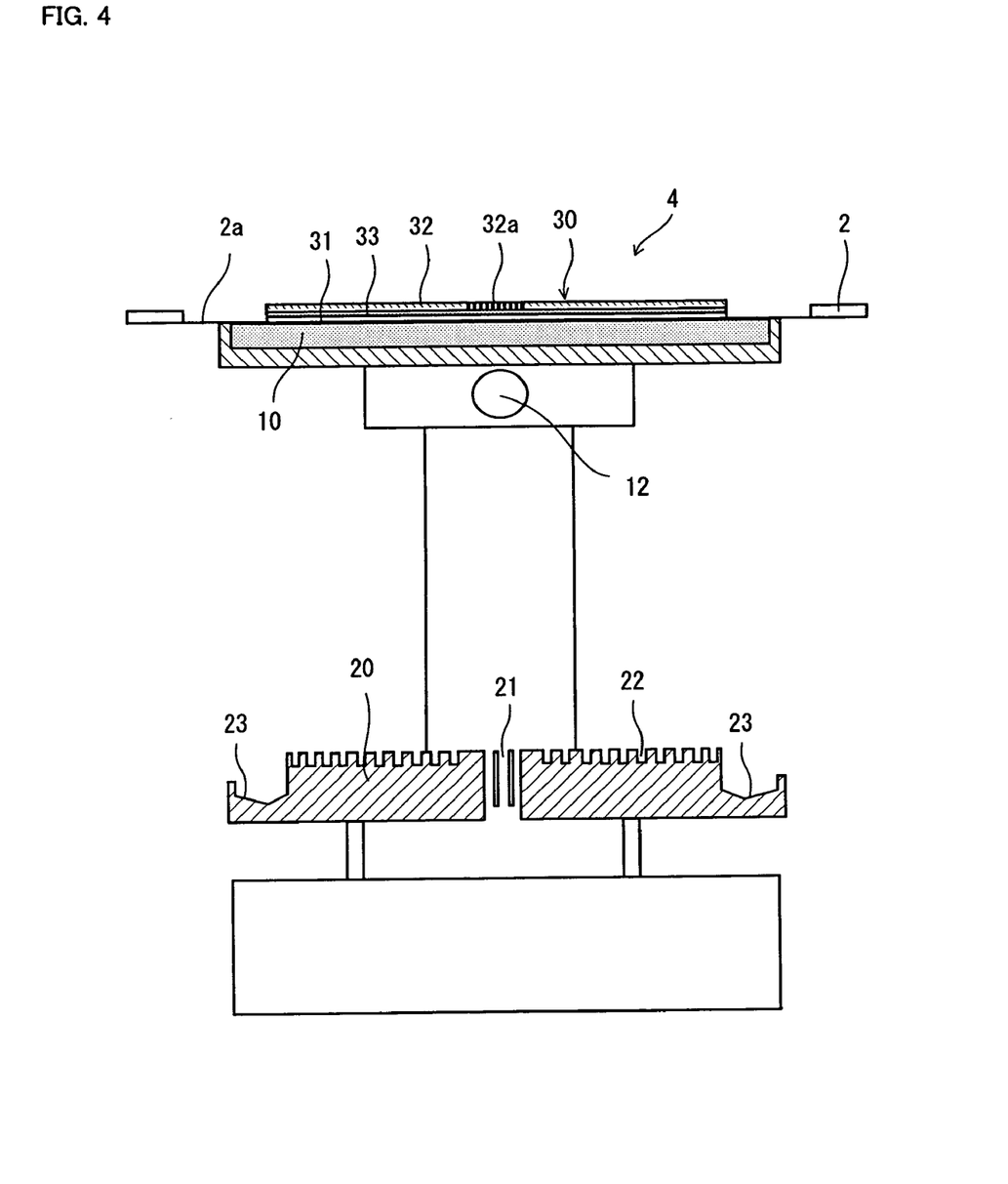
FIG. 4 shows a state where a layered structure is mounted on a chucking plate which is part of the stripping device.

In operation, a layered structure is taken out of the cassette 3A where a plurality of layered structures 30 are stored by the transfer robot 1, and is mounted on the top surface of the chucking plate 10 so as to be attracted and retained as shown in FIG. 4.

Figure 7:
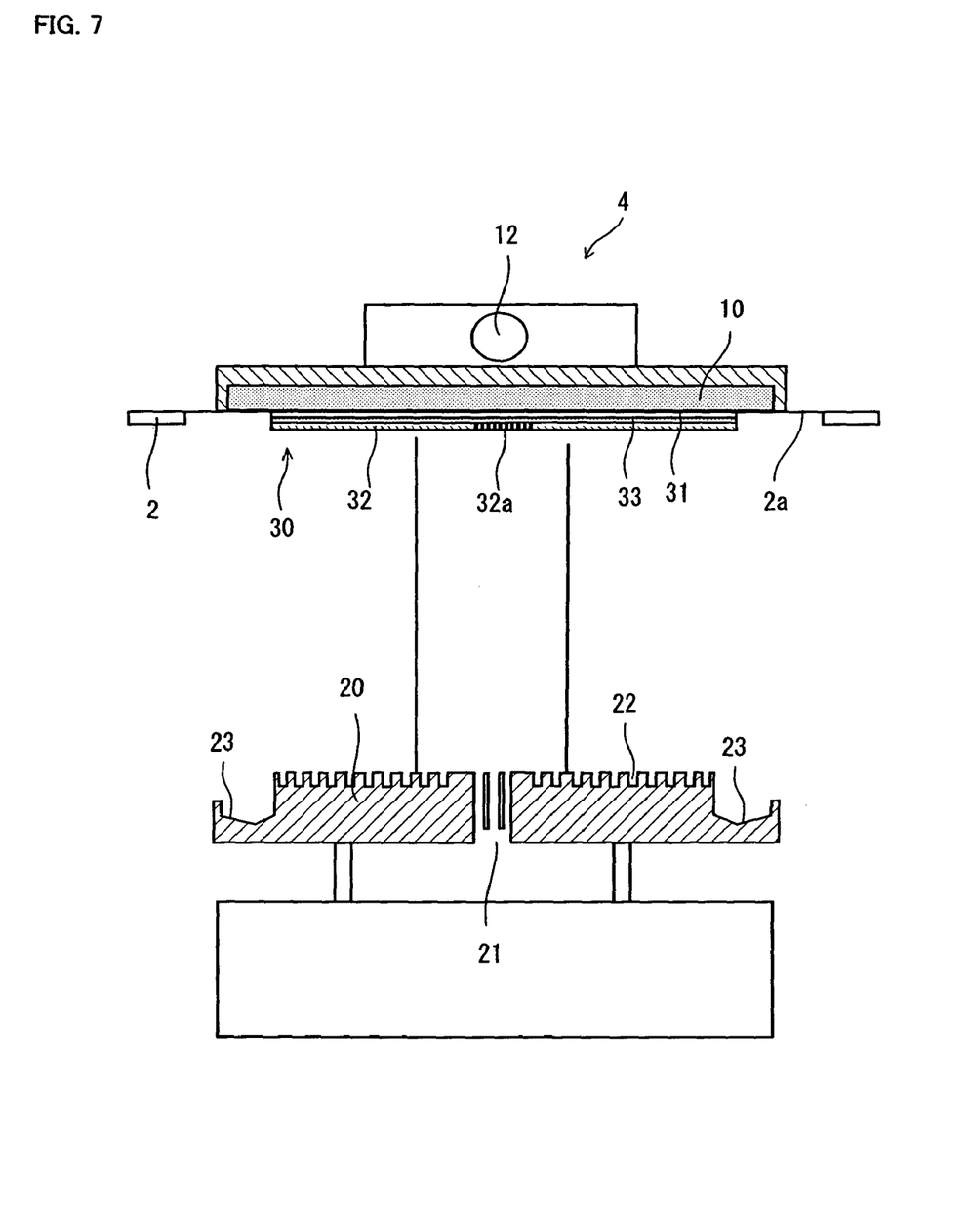
FIG. 7 shows a state where the chucking plate is rotated while chucking the layered structure.

Next, by operating a driving mechanism which is not shown in the drawing, the chucking plate 10 is rotated by 180 degrees so as to direct the layered structure 30 downward as shown in FIG. 7. In this state, the supporting plate side of the layered structure 30 is downward and the semiconductor wafer side of the layered structure 30 is upward.

Figure 8:
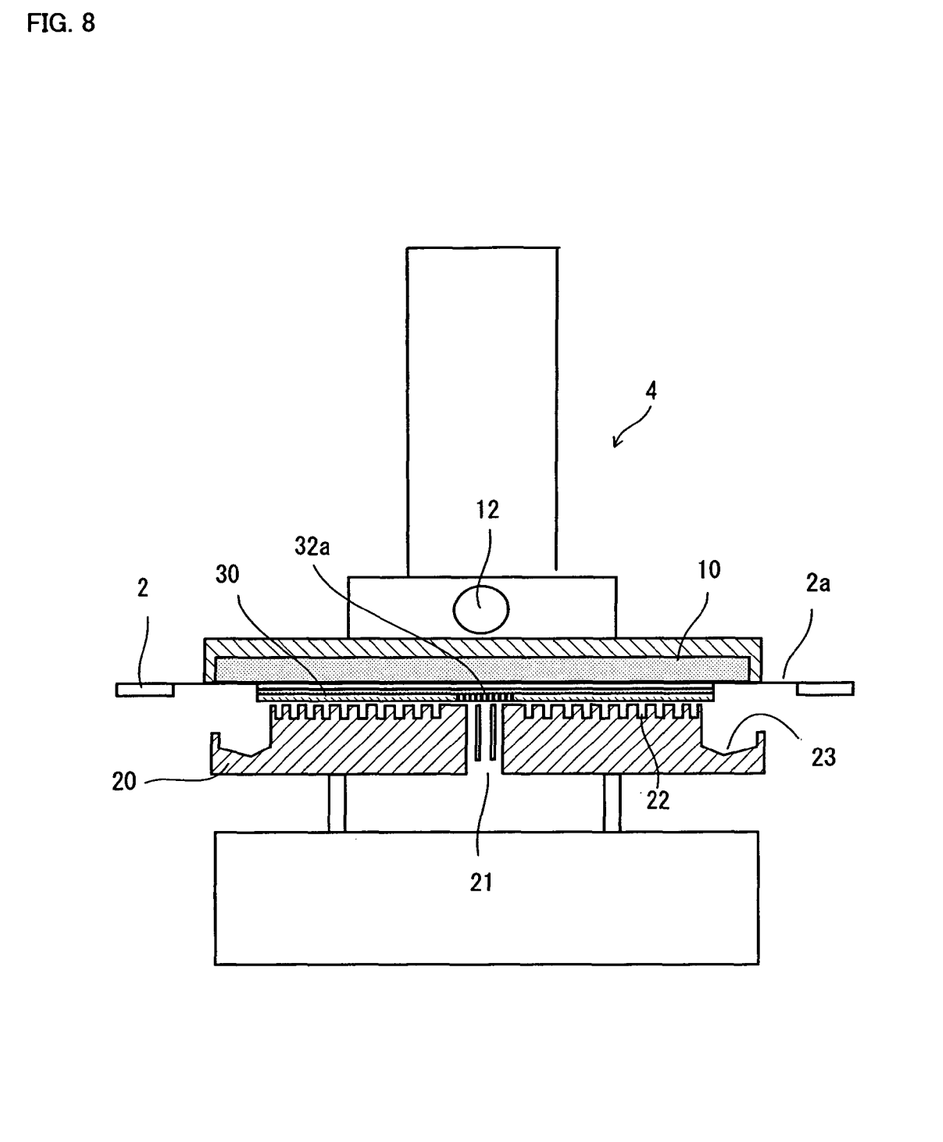
FIG. 8 shows a state where the layered structure is applied onto the stripping plate by the chucking plate.

Next, by lowering the chucking plate 10, the supporting plate side of the layered structure 30 is applied onto the top surface of the stripping plate 20 as shown in FIG. 8. The solvent supply holes 21 formed in the central portion of the stripping plate 20 and the penetrating hole 32a formed in the central portion of the supporting plate 32 correspond to each other in this state. The grooves 22 in the top surface of the stripping plate 20 are sealed by the lower surface of the supporting plate 32 so as to prevent a solvent from entering the grooves 22.

Next, a solvent is supplied to the adhesive 33 between the supporting plate 32 and the semiconductor wafer 31 through the solvent supplying holes 21 and the penetrating hole 32a. The solvent is supplied from the solvent withdrawing tank via the pipe as described above.

The solvent is distributed from the center to the periphery along the groove 32b so as to dissolve the adhesive 33. The solvent which has dissolved the adhesive 33 flows down to the recessed section 23 by gravity. The solvent is finally withdrawn to the solvent withdrawing tank described above.

Next, the supporting plate is stripped from the semiconductor wafer. The supporting plate 32 is attracted and retained on the top surface of the stripping plate 20. Therefore, when the chucking plate 10 is lifted as shown FIG. 9, the semiconductor wafer 31 and the dicing tape 2a (dicing frame 2) are also lifted, and the supporting plate 32 is left on the top surface of the stripping plate 20.

Figure 9:
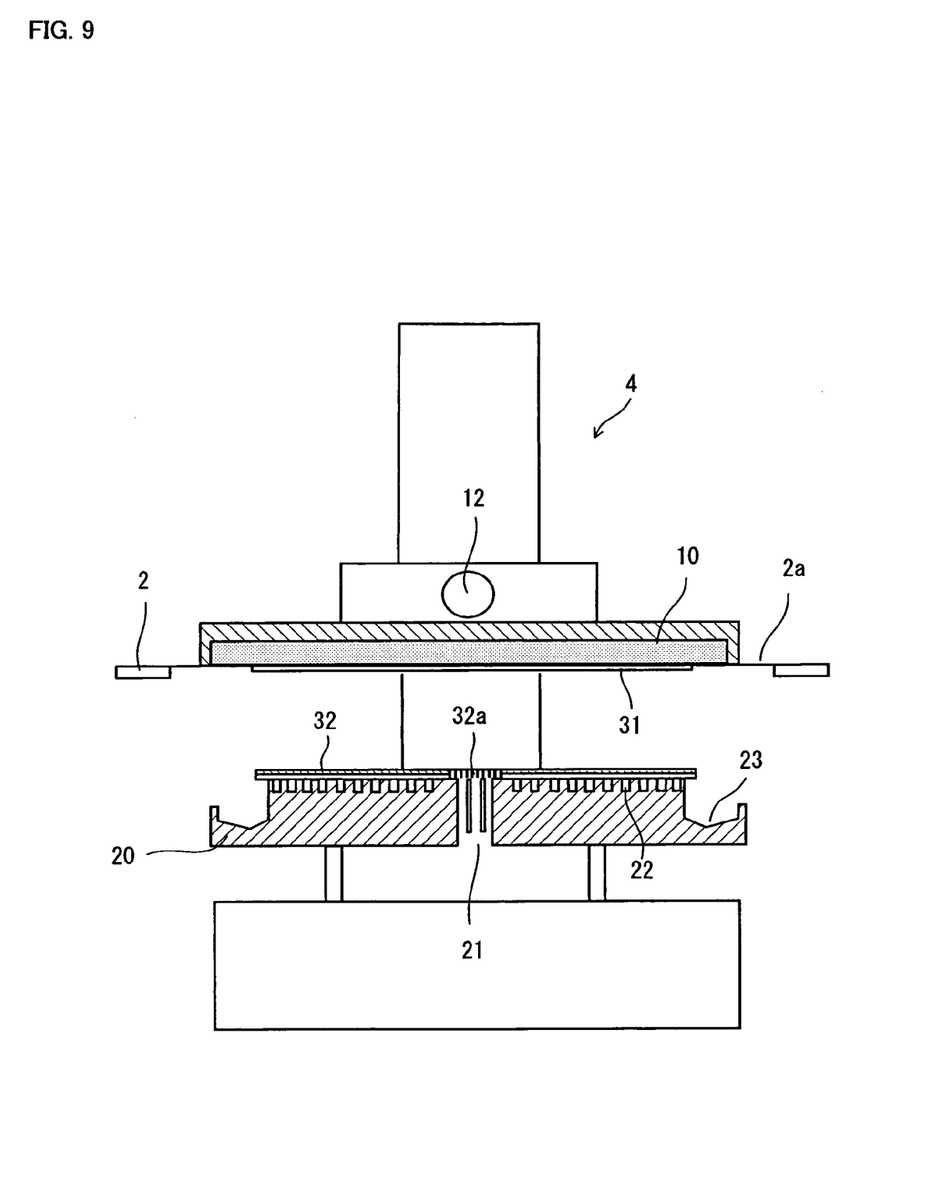
FIG. 9 shows a state where the supporting plate is stripped from the semiconductor wafer.

Next, an air purge is performed to the lower surface of the semiconductor wafer 31 by utilizing the solvent supply holes 21.

Next, the semiconductor wafer (with the dicing tape and the dicing frame) is transferred to the cleaning device by the transfer robot 1. The surface of the semiconductor wafer is cleaned by a solvent.

As described above, the solvent for cleaning is supplied from the new liquid supply tank via the pipe, and the solvent used for cleaning is withdrawn to the solvent withdrawing tank.

The semiconductor wafer (with the dicing tape and the dicing frame) is transferred to the cassette 3B by the transfer robot 1 and stored.

Figure 10:
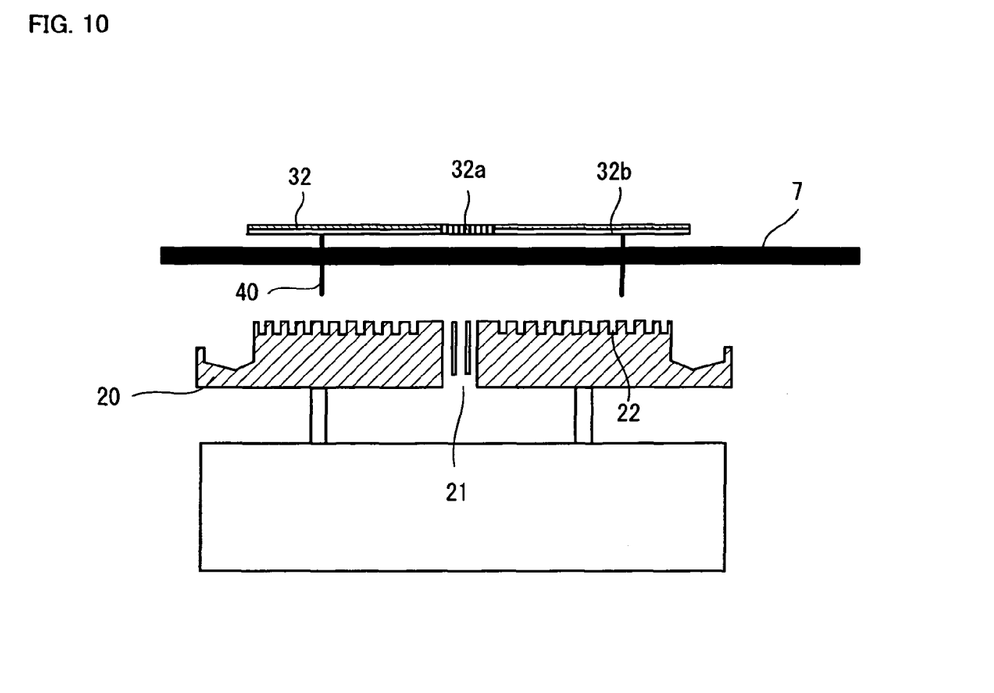
FIG. 10 shows a state where the supporting plate is withdrawn.

Incidentally, the supporting plate 32 left on the top surface of the stripping plate 20 is lifted by a pin 40 as shown in FIG. 10, and transferred to the cassette 6 by the withdrawing robot 7 and stored.

In this way, since the stripping apparatus of the present embodiments are provided with at least the transfer robot 1, and the cassette 3, the stripping device 4, and the cleaning device 5 which surround the transfer robot 1, in which the stripping device 4 is comprised of the chucking plate 10 for attracting and retaining the layered structure 30, the stripping plate 20 for stripping the supporting plate 32 from the layered structure 30, and the moving mechanism which rotates the chucking plate 10 by 180 degrees within a vertical plane and elevates and lowers the chucking plate in a vertical direction in a state of retaining the layered structure 30, it is possible to efficiently perform a series of processes for stripping the supporting plate 32 including a cleaning process in a single apparatus, and simplify the structure of the apparatus.

It is also possible to reduce the time for transferring the layered structure which is required because the processing devices are separately provided, and reduce the time for the stripping process.

Since the stripping device 4 is provided with the chucking plate 10 for rotating the layered structure 30, it is possible to easily mount the layered structure 30 on the chucking plate 10 (in a state where the semiconductor wafer side faces to the chucking plate 10) in a short period of time, and supply a solvent from below with respect to the chucking plate 10 and the layered structure 30 without installing a special rotating device. With this, it is possible to simplify the structure of the apparatus, reduce the time required for the stripping process, and solve the problem that the dicing tape is stripped from the layered structure 30 because the solvent leaks.

In addition, by installing the cleaning device 5, the cleaning liquid (solvent) which has been used in the cleaning device 5 can be reused in the stripping device 4.

According to the conventional art, since the stripping apparatus and the cleaning apparatus are provided separately, a solvent is required at a rate of 20 ml/min for ten minutes in the stripping apparatus, and a solvent is required at a rate of 250 ml/min for one minute in the cleaning apparatus. That is, a solvent (new liquid) of 450 ml is required in total. In contrast, according to the present invention in which the stripping device 4 (stripping apparatus) and the cleaning device 5 (cleaning apparatus) are integrated, although a solvent is required at a rate of 250 ml/min for one minute in the cleaning device in the same manner as the conventional art, all the solvent used in the cleaning device can be reused for ten minutes in the stripping apparatus. Therefore, it is possible to greatly reduce the required amount of a new solvent.

Next, another embodiment of the stripping apparatus according to the present invention will be described.

In the above-described embodiment, the stripping apparatus comprises the transfer robot 1, the cassette 3, the stripping device 4, the cleaning device 5, the dicing tape mounter, and so on. However, the stripping apparatus in which no dicing tape mounter is installed is also possible.

Incidentally, in the above-described embodiments, when the supporting plate 32 is stripped from the semiconductor wafer, the supporting plate 32 is hard to strip because the supporting plate 32 sticks to the semiconductor wafer due to the surface tension of the solvent which has dissolved the adhesive. In this instance, by supplying air to the penetrating hole of the supporting plate 32 through the solvent supply hole 21 of the stripping plate 20, the surface tension is eliminated, so that the supporting plate 32 becomes easy to strip. For this purpose, an air supply means is provided in the stripping device, and a tube from the air supply means is connected to a tube which connects to the penetrating hole of the supporting plate 32.

Also, as another embodiment, a plurality of stripping devices may be provided (for example, in a longitudinal direction) so as to further reduce the time required for processing in the stripping apparatus. Specifically, a plurality of stripping devices having the chucking plate 10 constructed to be rotatable by 180 degrees within a vertical plane are provided, and a stripping device having a stripping plate only is provided therebetween. Also, the number of stripping plates can be increased based on the processing time.

The present invention is not limited to the above-mentioned embodiments, and other various structures are possible within the scope of the present invention.

EFFECT OF THE INVENTION

According to the stripping device and the stripping apparatus, it is possible to simplify the structure, save the space, and strip a supporting plate in a shorter period of time. It is also possible to reduce the required amount of a new solvent.

Accordingly, the present invention is suitable to strip a supporting plate from a substrate, and this stripping apparatus can do so with high performance and reliability.

What is claimed is:

1. A stripping device for stripping a supporting plate from a layered structure in which a substrate is adhesively bonded to the supporting plate, comprising:
    a chucking plate for attracting and retaining the layered structure including the substrate and the supporting plate adhesively bonded together;
    a stripping plate for stripping the supporting plate from the layered structure; and
    and a moving mechanism which rotates the chucking plate by 180° within a vertical plane, and elevates and lowers the chucking plate in a vertical direction in a state of retaining the layered structure;
    wherein the stripping plate includes a plurality of solvent supply holes defined therethrough, a plurality of grooves defined in a face thereof and connecting to a vacuum source, and a recessed section for withdrawing solvent.

2. The stripping device according to claim 1, wherein the stripping plate is non-rotatable and is combined with the chucking plate and the moving mechanism such that the moving mechanism supports the chucking plate directly above the stripping plate.

3. The stripping device according to claim 1, wherein a dicing tape and a dicing frame are attached to a surface of the layered structure and the chucking plate is configured to attract and retain the layered structure having the dicing frame and dicing tape attached thereto while being rotated by the moving mechanism.

4. A stripping apparatus for stripping a supporting plate from a layered structure in which a substrate is adhesively bonded to the supporting plate, comprising:
    a transfer robot;
    a cassette provided so as to surround the transfer robot;
    the stripping device according to claim 1; and
    a cleaning device which cleans substrates.

5. The stripping apparatus according to claim 4, wherein the stripping plate is non-rotatable and is combined with the chucking plate and the moving mechanism such that the moving mechanism supports the chucking plate directly above the stripping plate.

6. The stripping apparatus according to claim 4, wherein a dicing tape and a dicing frame are attached to a surface of the layered structure and the chucking plate is configured to attract and retain the layered structure having the dicing frame and dicing tape attached thereto while being rotated by the moving mechanism.

7. The stripping apparatus according to claim 5, wherein a dicing tape and a dicing frame are attached to a surface of the layered structure and the chucking plate is configured to attract and retain the layered structure having the dicing frame and dicing tape attached thereto while being rotated by the moving mechanism.

8. The stripping apparatus according to claim 4, wherein the robot moves at least one of the substrate and the layered structure relative to the cassette, the stripping device and the cleaning device.

9. The stripping apparatus according to claim 4, wherein the robot is surrounded by the cassette, the stripping device and the cleaning device.

10. The stripping apparatus according to claim 4, wherein the chucking plate is connected to a horizontal pivot shaft of the moving mechanism and about which the moving mechanism rotates the chucking plate by 180° within the vertical plane.

11. The stripping apparatus according to claim 4, wherein the recessed section is defined in a periphery of the stripping plate to collect the solvent for withdrawal.

12. The stripping apparatus according to claim 4, wherein the cassette stores at least one of the substrate and the layered structure.

13. The stripping device according to claim 2, wherein a dicing tape and a dicing frame are attached to a surface of the layered structure and the chucking plate is configured to attract and retain the layered structure having the dicing frame and dicing tape attached thereto while being rotated by the moving mechanism.

14. The stripping device according to claim 1, wherein the chucking plate is connected to a horizontal pivot shaft of the moving mechanism and about which the moving mechanism rotates the chucking plate by 180° within the vertical plane.

15. The stripping device according to claim 1, wherein the recessed section is defined in a periphery of the stripping plate to collect the solvent for withdrawal.

16. The stripping device according to claim 4, wherein the cassette stores at least one of the substrate and the layered structure.

17. The stripping device according to claim 1, wherein the support plate has a penetrating hole defined therein for permitting a stripping solvent to flow therethrough to adhesive bonding the substrate to the support plate.

18. The stripping device according to claim 1, wherein the moving mechanism includes a horizontal shaft which supports the chucking table in upwardly-facing and downwardly-facing positions, and which rotates the chucking table in the vertical plane between the two positions, and an elevating member extending vertically between the chucking plate and the stripping plate and along which the chucking plate is elevated and lowered in the vertical direction.

19. The stripping apparatus according to claim 4, wherein the support plate has a penetrating hole defined therein for permitting a stripping solvent to flow therethrough to adhesive bonding the substrate to the support plate.

20. The stripping apparatus according to claim 4, wherein the moving mechanism includes a horizontal shaft which supports the chucking table in upwardly-facing and downwardly-facing positions, and which rotates the chucking table in the vertical plane between the two positions, and an elevating member extending vertically between the chucking plate and the stripping plate and along which the chucking plate is elevated and lowered in the vertical direction.

* * * * *